(12) United States Patent  
Kim et al.

(10) Patent No.: US 7,795,803 B2
(45) Date of Patent: Sep. 14, 2010

(54) ORGANIC LIGHT EMITTING DISPLAY AND METHOD OF FABRICATING THE SAME

(75) Inventors: Deuk Jong Kim, Yongin-si (KR); Seung Yong Song, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 929 days.

(21) Appl. No.: 11/512,651

(22) Filed: Aug. 29, 2006

(65) Prior Publication Data

US 2007/0176548 A1    Aug. 2, 2007

(30) Foreign Application Priority Data

Jan. 27, 2006    (KR)    .................... 10-2006-0008767

(51) Int. Cl.
*H05B 33/00*    (2006.01)
(52) U.S. Cl. .................... 313/504; 313/506; 313/512; 445/25; 445/43
(58) Field of Classification Search .................... None
See application file for complete search history.

(56) References Cited

U.S. PATENT DOCUMENTS

| 4,238,704 | A | 12/1980 | Bonk et al. | |
|---|---|---|---|---|
| 5,708,325 | A * | 1/1998 | Anderson et al. | 313/495 |
| 6,555,025 | B1 | 4/2003 | Krupetsky et al. | |
| 7,332,856 | B2 * | 2/2008 | Kijima et al. | 313/495 |
| 7,378,788 | B2 * | 5/2008 | Ando | 313/495 |
| 2005/0195355 | A1 | 9/2005 | Kwak et al. | |
| 2005/0248270 | A1 | 11/2005 | Ghosh et al. | |
| 2008/0012467 | A1 * | 1/2008 | Negishi | 313/495 |

FOREIGN PATENT DOCUMENTS

| CN | 1561551 A | 1/2005 |
|---|---|---|
| JP | 09-278483 | 10/1997 |
| JP | 10-074583 | 3/1998 |
| JP | 2003-229250 | 8/2003 |
| JP | 2006-004909 | 1/2006 |
| WO | WO 2004-0945597 A2 | 11/2004 |

OTHER PUBLICATIONS

Office Action issued on Aug. 1, 2008 in corresponding Chinese patent application No. 200710001572.1 in 15 pages.
An Office Action dated Jul. 14, 2009 of the Japanese Patent Application No. 2006-153566.

* cited by examiner

*Primary Examiner*—Ashok Patel
(74) *Attorney, Agent, or Firm*—Knobbe Martens Olson & Bear LLP

(57) ABSTRACT

An organic light emitting display and a method of fabricating the same, and more particularly, an organic light emitting display in which the surface of a substrate contacted to a frit is made non-planar to improve an adhesive force and a method of fabricating the same are disclosed. The organic light emitting display includes a first substrate including a pixel region in which at least one organic light emitting diode (OLED) is formed and a non-pixel region formed on the outer circumference of the pixel region so that one region of the non-pixel region is made with one or more non-planar structures, a second substrate attached to the first substrate so that the OLED is encapsulated with a frit interposed between the first substrate and the second substrate and contacted to the non-planar structures.

25 Claims, 7 Drawing Sheets laser irradiation

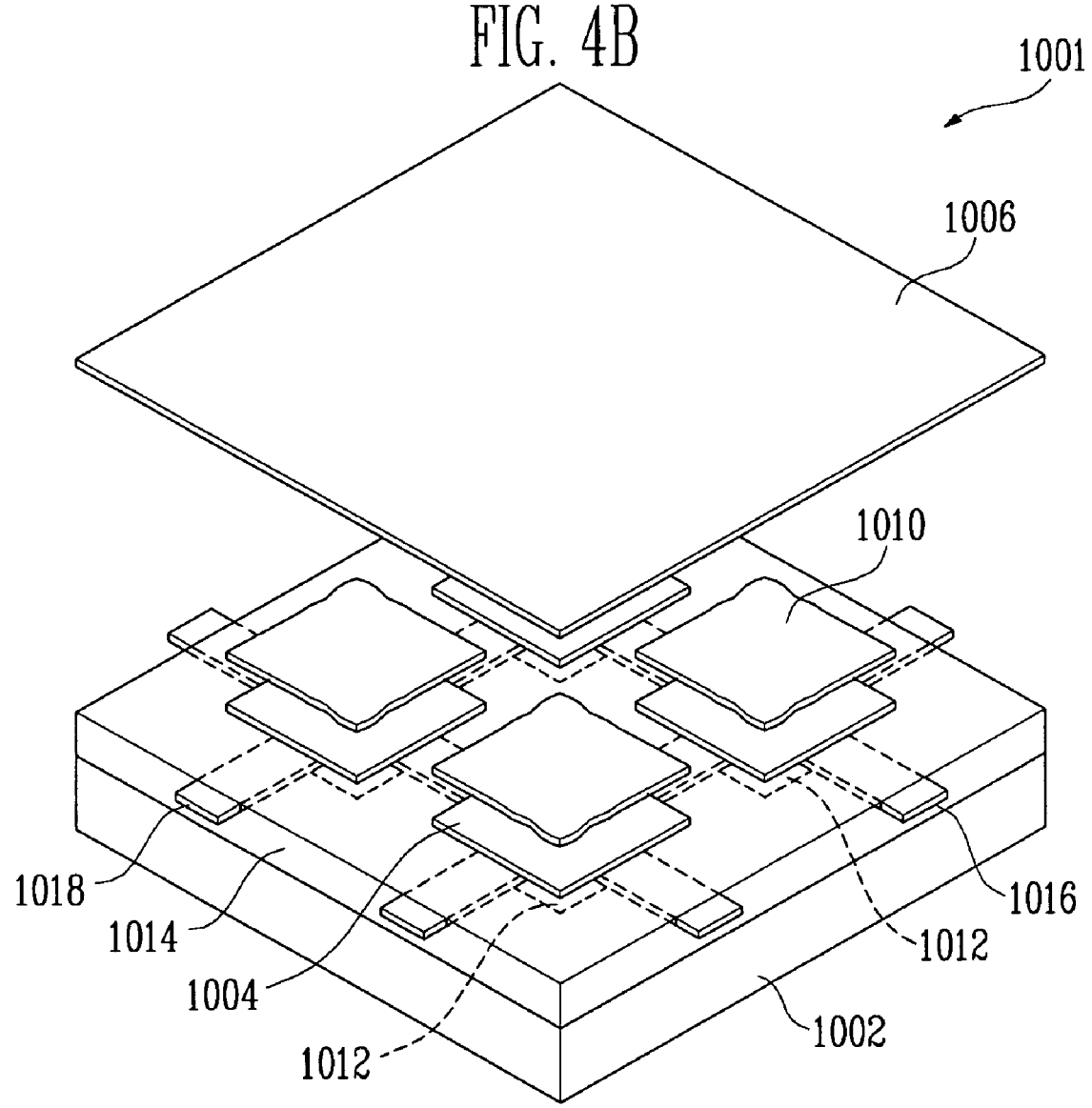

ORGANIC LIGHT EMITTING DISPLAY AND METHOD OF FABRICATING THE SAME

CROSS-REFERENCE TO RELATED APPLICATIONS

This application claims the benefit of Korean Patent Application No. 2006-8767, filed on Jan. 27, 2006, in the Korean Intellectual Property Office, the disclosure of which is incorporated herein by reference.

BACKGROUND OF THE INVENTION

1. Field of the Invention

The present invention relates to organic light emitting display devices. More particularly, the present invention relates to packaging of organic light emitting display devices.

2. Description of the Related Art

Recently, organic light emitting displays (OLED) that use organic light emitting diodes are spotlighted.

The organic light emitting displays are spontaneous emission displays that electrically excite organic compounds to emit light and can be driven at a low voltage, can be easily made thin, and have a wide view angle and high response speed.

The organic light emitting display includes a plurality of pixels that include Organic light emitting diodes that are formed on a substrate and thin film transistors (TFT) for driving the Organic light emitting diodes. The Organic light emitting diodes are sensitive to oxygen and moisture. Therefore, a sealing structure in which the oxygen and moisture are prevented from penetrating by covering a deposition substrate with a metal cap coated with an absorbent or a sealing glass substrate is provided.

A method of coating a glass substrate with a frit to seal up an OLED is disclosed in U.S. Pat. No. 6,998,776. As disclosed in the U.S. Pat. No. 6,998,776, a gap between a substrate and a sealing substrate is completely sealed up using the frit so that it is possible to effectively protect the OLED.

Although the frit of U.S. Pat. No. 6,998,776 does seal the gap between the substrates, there can be problems with the lifespan of the seal. The adhesion force provided by the frit between the substrates may deteriorate such that the substrates may become separated. In such a case, the oxygen and moisture may penetrate into the OLED to deteriorate the life span and the emission efficiency of the organic light emitting display. What is needed is a method of adhering the substrates that provides improved reliability and a longer lifespan.

The discussion in this section is to provide a general background of organic light-emitting display devices and is not an admission of prior art.

SUMMARY OF CERTAIN INVENTIVE ASPECTS

One aspect of the invention provides an organic light emitting device. This device includes a first substrate, a second substrate, and an array of organic light emitting pixels interposed between the first and second substrates. This device further includes a frit seal surrounding the array while interposed between and interconnecting the first and second substrates, wherein the frit seal and the first substrate are integrated with each other and form an integrating interface therebetween, and wherein the integrating interface comprises a three-dimensional geography.

In the above described device, the three-dimensional geography may comprise at least one peak and at least one valley. The integrating interface may be not substantially planar throughout. The three-dimensional geography may comprise an undulating shape. The integrating interface may comprise a three-dimensional engaging surface of the first substrate and a complementary engaging surface of the frit. The integrating interface may comprise a trace of bonding. The integrating interface may substantially separate a material of the frit seal and a material of the first substrate. The material of the frit seal and the material of the first substrate may be mixed together along the integrating interface.

Still referring to the above described device, the first substrate may be made of a single layer or two or more layers of different materials. In the case where the first substrate comprises two or more layers, the integrating interface may be formed in only one of the two or more layers, or may be formed through two or more of the layers. The first substrate may further comprise structures that are separated from the integrating interface. The array may be disposed on the first substrate or on the second substrate. The frit seal and the second substrate may integrated with each other and form another integrating interface therebetween, wherein the other integrating interface comprises a three-dimensional geography. There may substantially no bubbles in the vicinity of the integrating interface or there may be bubbles in the vicinity of the integrating interface.

Another aspect of the invention provides a method of making an electronic device. This method includes providing a first substrate comprising a three-dimensional engaging structure, providing a second substrate, and interposing a frit and an array of organic light emitting pixels between the first and second substrates, where the frit surrounds the array. The method further includes contacting the frit with the three-dimensional engaging structure of the first substrate, and melting and resolidifying at least part of the frit such that the frit is integrated with the three-dimensional engaging structure, thereby forming an integrating interface which comprises a three-dimensional geography.

In the above described method, the integrating interface may be not substantially planar throughout. The three-dimensional geography may comprise an undulating shape. The first substrate may comprise two or more layers of different materials. The second substrate may comprise a three-dimensional engaging structure, in which case the method further includes contacting the frit with the three-dimensional engaging structure of the second substrate, and wherein melting and resolidifying further integrates the frit with the three-dimensional engaging structure of the second substrate, thereby forming another integrating interface which comprises a three-dimensional geography. The frit may comprise a preformed engaging structure complementary to the three-dimensional engaging structure of the first substrate. The frit may comprise a moldable material prior to melting, wherein contacting the frit with the three-dimensional engaging structure forms the complementary three-dimensional structure in the moldable material.

BRIEF DESCRIPTION OF THE DRAWINGS

These and/or other objects and advantages of the invention will become apparent and more readily appreciated from the following description of the preferred embodiments, taken in conjunction with the accompanying drawings of which:

FIG. 4B is a schematic exploded view of an active matrix type organic light emitting display device in accordance with one embodiment.

DETAILED DESCRIPTION OF CERTAIN INVENTIVE EMBODIMENTS

Hereinafter, preferable embodiments according to the present invention will be described with reference to the attached drawings.

An organic light emitting display (OLED) is a display device comprising an array of organic light emitting diodes. Organic light emitting diodes are solid state devices which include an organic material and are adapted to generate and emit light when appropriate electrical potentials are applied.

Figure 4A:
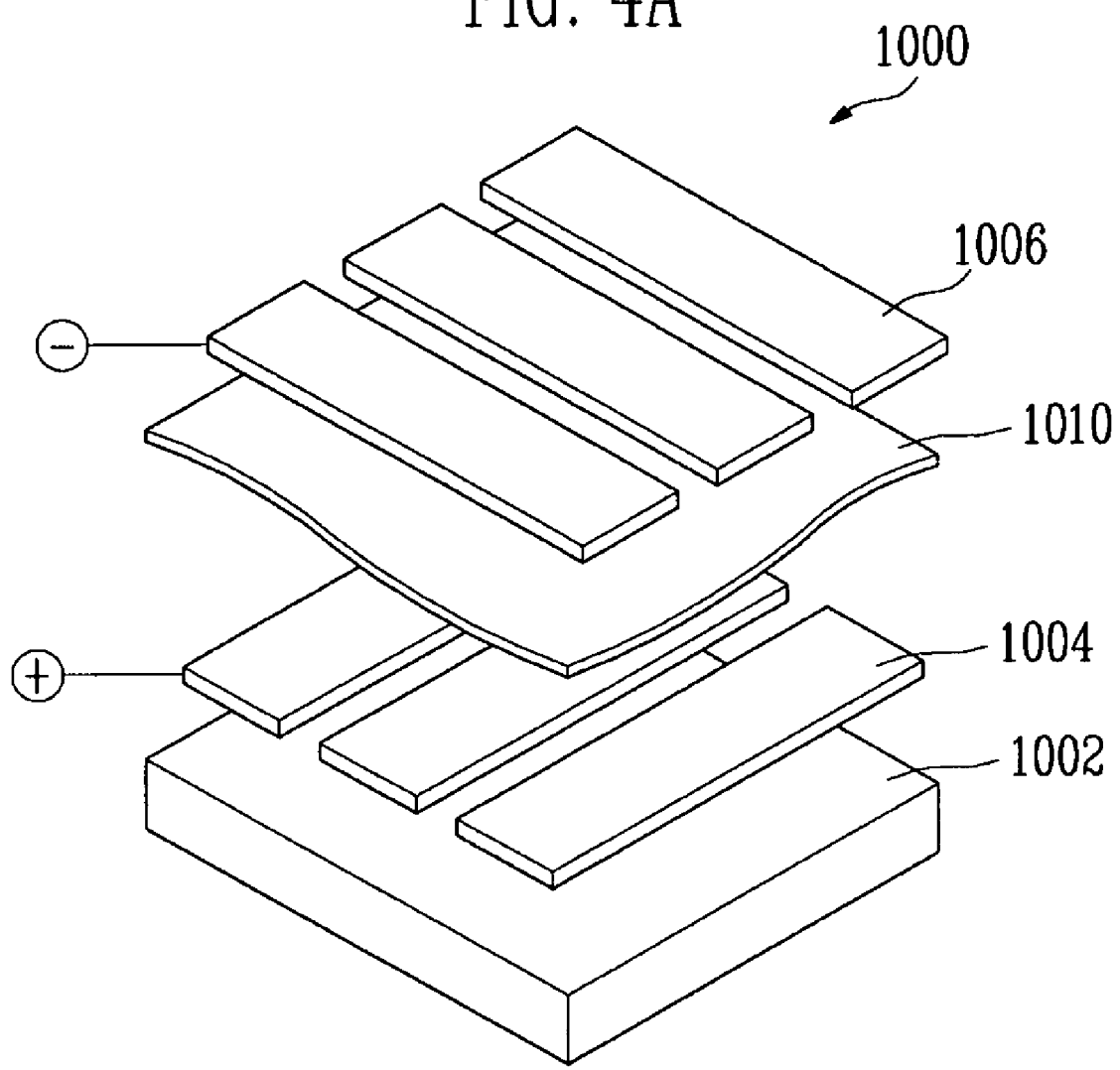
FIG. 4A is a schematic exploded view of a passive matrix type organic light emitting display device in accordance with one embodiment.

OLEDs can be generally grouped into two basic types dependent on the arrangement with which the stimulating electrical current is provided. FIG. 4A schematically illustrates an exploded view of a simplified structure of a passive matrix type OLED 1000. FIG. 4B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical potential is applied between the anode 1004 and cathode 1006, visible light is emitted from the organic layer.

Referring to FIG. 4A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 4B, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply select signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002; The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT.

AMOLEDs have the advantage of fast refresh rates improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical potential is applied between the anode 1004 and cathode 1006, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green or red. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 4C:
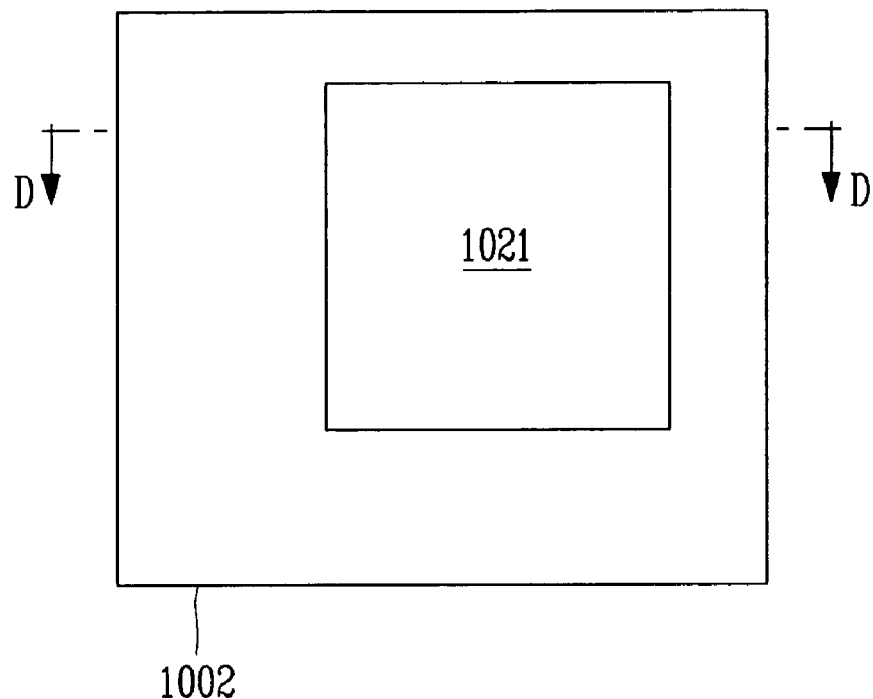
FIG. 4C is a schematic top plan view of an organic light emitting display in accordance with one embodiment.

In many embodiments, an OLED pixel array 1021 comprising a plurality of organic light emitting pixels is arranged over a substrate 1002 as shown in FIG. 4C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 4D:
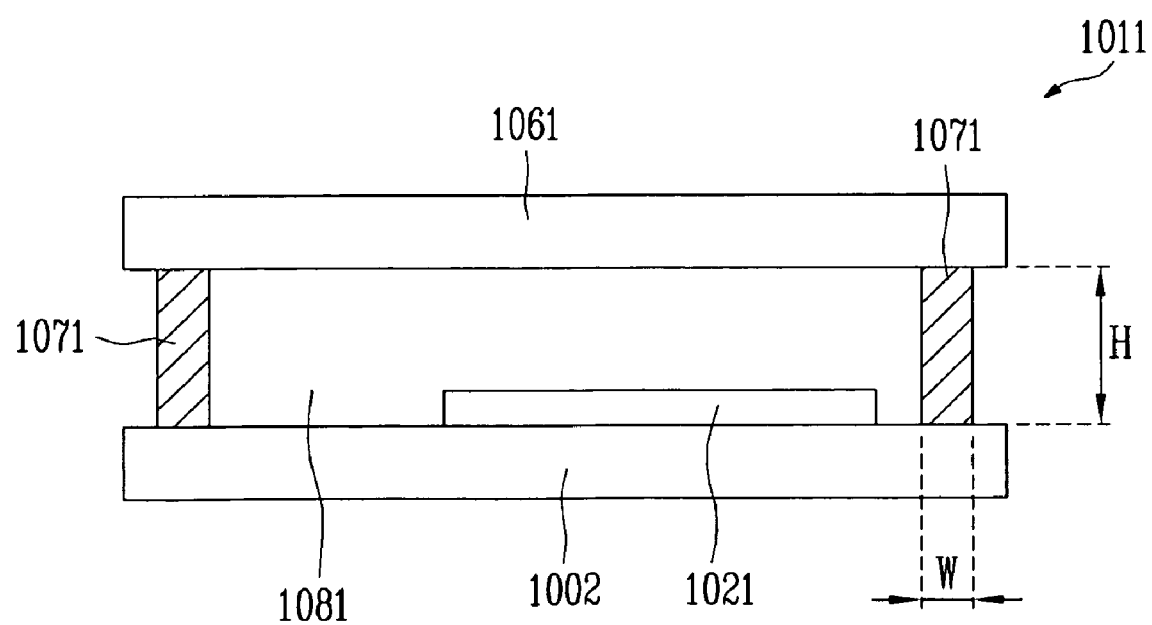
FIG. 4D is a cross-sectional view of the organic light emitting display of FIG. 4C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 4D schematically illustrates a cross-section of an encapsulated OLED device 1011 having a layout of FIG. 4C and taken along the line d-d of FIG. 4C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 4D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 4D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or glass frit," which includes fine glass particles. The frit particles includes one or more of magnesium oxide (MgO), calcium oxide (CaO), barium oxide (BaO), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 4E:
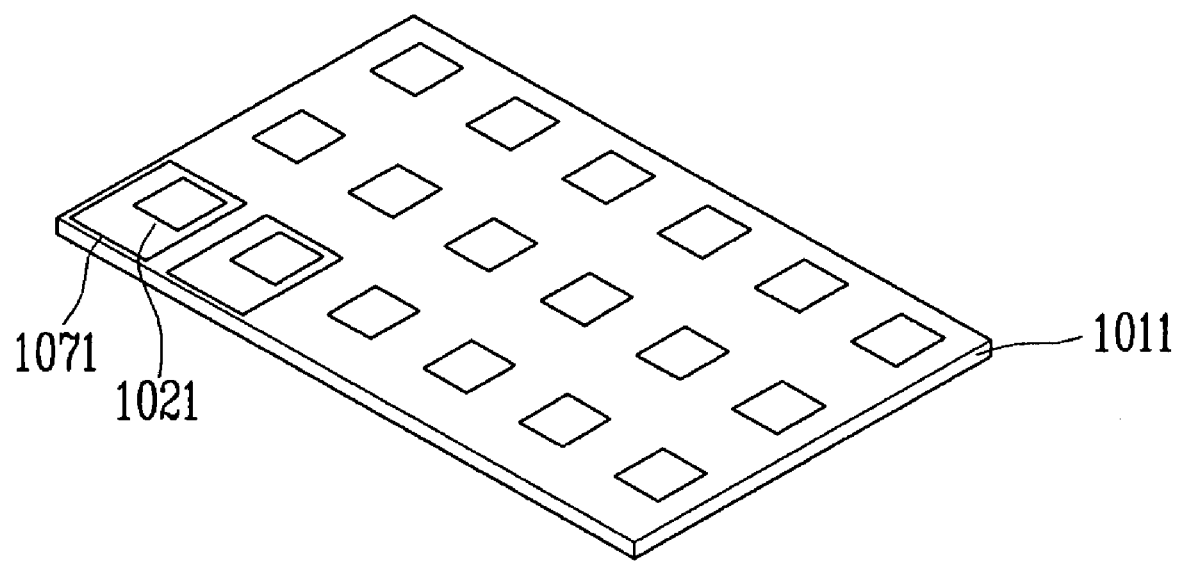
FIG. 4E is a schematic perspective view illustrating mass production of organic light emitting devices in accordance with one embodiment.

In some embodiments, OLED devices 1011 are mass produced. In an embodiment illustrated in FIG. 4E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 4D. In certain embodiments, the individual OLED devices 1011 then further undergo additional packaging operations to further improve the sealing formed by the frit seal 1071 and the top and bottom substrates 1061, 1002.

Figure 1:
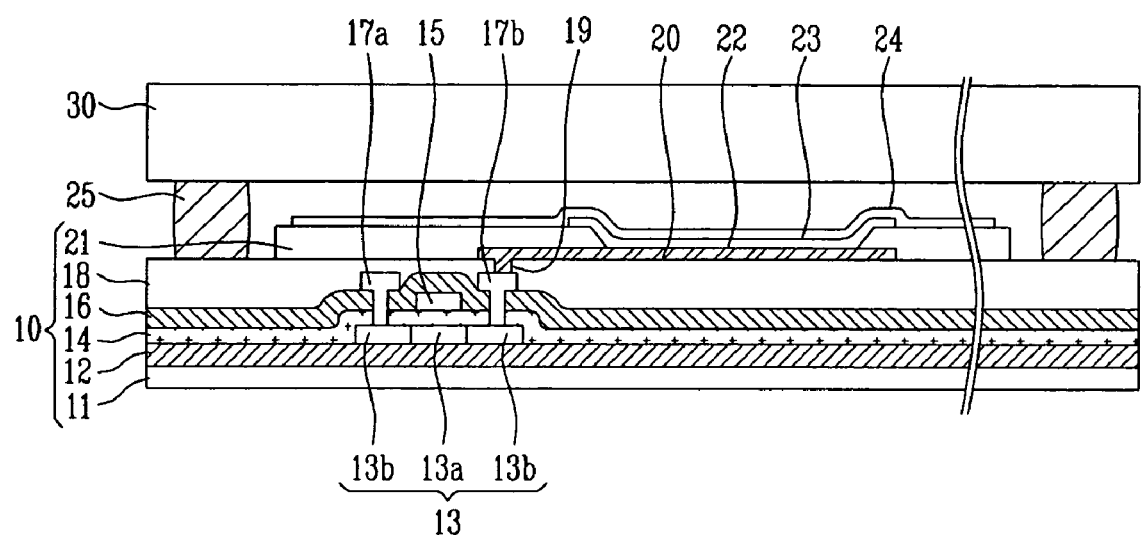
FIG. 1 is a sectional view illustrating a embodiment of an organic light emitting display.

FIG. 1 is a sectional view illustrating an organic light emitting display. Referring to FIG. 1, the organic light emitting display includes a first substrate 10, a frit 25, and a second substrate 30. The first substrate 10 including a deposition substrate 11 and at least one organic light emitting diode including a first electrode 20, an organic layer 22, and a second electrode 23 formed above the deposition substrate 11. First, a buffer layer 12 is formed on the deposition substrate 11. The deposition substrate 11 may comprise glass and the buffer layer is formed of an insulating material such as SiO2 and SiNx. The buffer layer 12 is formed to prevent the deposition substrate 11 from being damaged by factors such as heat from the outside.

A semiconductor layer 13, including an active layer 13a and source and drain regions 13b is formed on at least one region of the buffer layer 12. A gate insulating layer 14 is formed on the buffer layer 12 to cover the semiconductor layer 13. A gate electrode 15 of similar size to the active layer 13a is formed on one region of the gate insulating layer 14.

An interlayer insulation layer 16 is formed on the gate insulating layer 14 to include the gate electrode 15. Source and drain electrodes 17a and 17b are formed on a predetermined region of the interlayer insulation layer 16 so as to contact the source and drain regions 13b of the semiconductor layer 13.

A planarization layer 18 is formed on the interlayer insulation layer 16 to include the source and drain electrodes 17a and 17b. The first electrode 20 is formed on one region of the planarization layer 18. At this time, the first electrode 20 is connected to one exposed region of one of the source and drain electrodes 17a and 17b by a via hole 19.

A pixel definition layer 21, including an aperture that exposes at least one region of the first electrode 20, is formed on the planarization layer 18 to include the first electrode 20. An organic layer 22 is formed on the aperture of the pixel definition layer 21 and a second electrode layer 23 is formed on the pixel definition layer 21 to include the organic layer 22. A frit 25 is provided between a non-pixel region of the first substrate 10 and the second substrate 30 to adhere the first substrate 10 and the second substrate 30 to each other.

Figure 2A:
FIGS. 2A to 2C are sectional views illustrating a method of fabricating an organic light emitting display according to an embodiment.
Figure 2B:
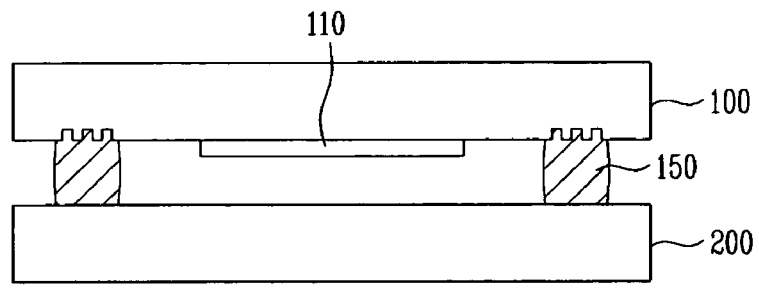
Figure 2C:
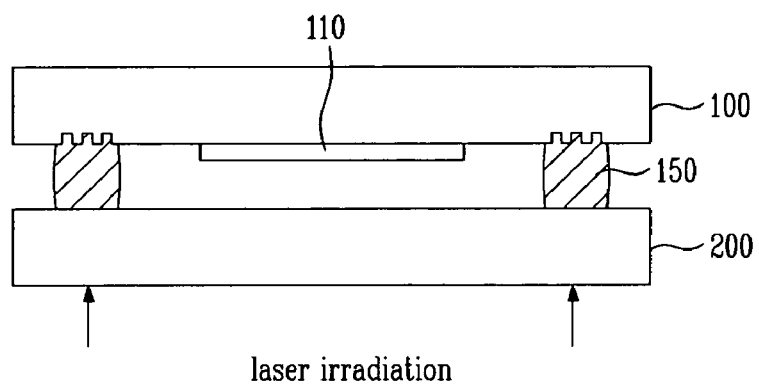

FIGS. 2A to 2C are sectional views illustrating a method of fabricating an organic light emitting display according to an embodiment. The organic light emitting display includes a first substrate 100 including a pixel region (not shown) in which at least one organic light emitting display device (OLED) 110 is formed. A non-pixel region (not shown) surrounds the pixel region. A second substrate 200 is attached to a portion of the non-pixel region of the first substrate 100 with a frit 150. According to a first method of fabricating the organic light emitting display, the frit 150 is applied on one region of the second substrate 200 such that the frit 150 is interposed between the second substrate 200 and the non-pixel region of the first substrate 100. In some embodiments, the frit 150 may include additives such as a filler material for controlling a thermal expansion coefficient and/or an absorbent material that absorbs laser or infrared rays.

In some embodiments, the frit 150 may be formed using a screen-printing method. According to the screen printing method, a desired pattern is designed to be drawn on a metal sheet, the portion of the metal sheet excluding the pattern is masked using an emulsion solution, and the frit is applied such that the desired pattern is printed on the second substrate 200.

After the frit 150 is applied to the substrate 200, the frit 150 is annealed at a predetermined temperature. Due to the process of annealing the frit 150, an organic material added to the frit 150 to make the frit 150 a gel-type paste is extinguished in the air such that the frit 150 is hardened or solidified. The process of annealing the frit 150 is preferably performed in a furnace at a temperature between 300° C. and 700° C. (FIG. 2A).

Next, the first substrate 100 is provided to be attached to the second substrate 200. At this time, in order to seal up the organic light emitting diode 110 formed on the first substrate 100, the first substrate 100 and the second substrate 200 are arranged such that the organic light emitting diode 110 is located between the substrates 100 and 200 and surrounded by the frit 150. In the example shown in FIGS. 2B and 2C, a region of the non-pixel region on the first substrate 100 includes non-planar structures formed on the surface where the frit contacts the substrate 100. The non-planar structures comprise one or more valleys and peaks, or other forms of three-dimensional geography, and serve to increase the contact surface area of an integrating interface where the frit 150 and the first substrate 100 are connected to each other. The increased contact surface area improves the adhesive force provided by the frit 150 adhering the first substrate 100 to the second substrate 200. The surface contacted to the frit 150 of the first substrate 100 is preferably an inorganic layer. When the frit 150 is directly contacted to an organic layer, the organic layer may be vulnerable to heat and may be damaged by high temperatures such as when a laser beam is used to irradiate the frit 150. Therefore, the adhesive force between the surface and the frit 150 may deteriorate. The process of making the non-planar structures on the exposed surface of the first substrate 100 may be performed by etching, preferably, dry etching. The dry etching process may include methods such as ion beam etching, RF sputtering etching, and reactive ion etching.

After the substrates 100 and 200 are attached by the frit 150, the frit 150 is irradiated with a laser beam or infrared rays to be melted such that the first substrate 100 and the second substrate 200 are adhered to each other. At this time, the preferable intensity of the laser beam for melting the frit 150 is in a range of about 20 W to about 60 W (FIG. 2C)

Figure 3A:
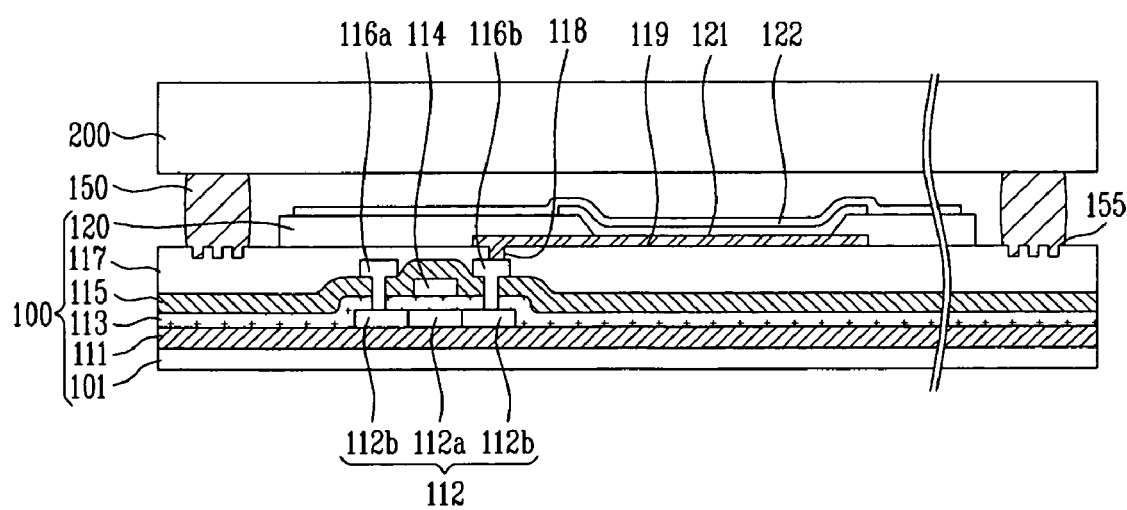
FIG. 3A illustrates an organic light emitting display according to an embodiment.

FIG. 3A illustrates an organic light emitting display according to an embodiment. Referring to FIG. 3A, the organic light emitting display includes the first substrate 100, the frit 150, and the second substrate 200.

The first substrate 100 includes a deposition substrate 101 and at least one organic light emitting diode formed on the deposition substrate 101. First, a buffer layer 111 is formed on the deposition substrate 101. The deposition substrate 101 is formed of glass and the buffer layer 111 is formed of an insulating material such as SiO2 and SiNx. The buffer layer 111 is formed to prevent the deposition substrate 101 from being damaged by factors such as heat from the outside.

A semiconductor layer 112 including an active layer 112a and source and drain regions 112b is formed on at least one region of the buffer layer 111. A gate insulation layer 113 is formed on the buffer layer 111 to cover the semiconductor layer 112. A gate electrode 114 of a similar size corresponding to the width of the active layer 112a is formed on one region of the gate insulation layer 113.

An interlayer insulation layer 115 is formed on the gate insulation layer 113 to include the gate electrode 114. Source and drain electrodes 116a and 116b are formed on a predetermined region of the interlayer insulation layer 115. Each of the source and drain electrodes 116a and 116b is connected to one exposed region of each of the source and drain regions 112b. A planarization layer 117 is formed on the interlayer insulation layer 115 to cover at least the source and drain electrodes 116a and 116b.

A first electrode 119 is formed on one region of the planarization layer 117 such that the first electrode layer 119 is connected to an exposed region of one of the source and drain electrodes 116a and 116b by a via hole 118. At this time, at least one non-planar structure 155 is formed in a portion of the the non-pixel region of the planarization layer 117. The non-planar structures comprise one or more valleys and peaks. The valleys and peaks of the non-planar structure 155 may be rectangular in cross section as shown in FIG. 3A, but this is only an example. The non-planar structures 155 may be of any regular or irregular shape such as triangular, semicircular, smooth edged, sharp edged, undulating, etc.

At this time, since the planarization layer 117 is formed on the uppermost layer of the first substrate 100 to be adhered to the frit 150 and the surface including the non-planar structures 155 is directly contacted to the frit 150, the adhesive force between the frit 150 and the planarization layer 117 is stronger than if there were no non-planar structures. Therefore, the planarization layer 117 is made non-planar to increase the area in which the planarization layer 117 and the frit 150 are contacted to each other so that it is possible to improve the adhesive force afforded by the frit 150 between the first substrate 100 and the second substrate 200. The planarization layer 117 is preferably formed of an inorganic insulation layer. Thus, when a laser beam or infrared rays are used to irradiate the frit 150 to melt the frit 150, the inorganic layer is insensitive to heat, and the organic light emitting diode is not damaged. The non-planar structures 155 may be formed in the planarazation layer by etching, preferably dry etching. The dry etching may be performed methods such as ion beam etching, RF sputtering etching, and reactive ion etching.

A pixel definition layer 120 including an aperture that exposes at least one region of the first electrode 119 is formed on the planarization layer 117 over the first electrode 119.

An organic layer 121 is formed on the aperture of the pixel definition layer 120. A second electrode layer 122 is formed on the pixel definition layer 120 to cover the organic layer 121.

The frit 150 is provided between the first substrate 100 and the second substrate 200 to adhere the first substrate 100 and the second substrate 200 to each other. The frit 150 is provided between a portion of the non-pixel region (not shown) on the first substrate 100 and the second substrate 200. The non-pixel region is a region in which the organic light emitting diode including the first electrode 119, the organic layer 121, and the second electrode 122 is not formed.

The frit 150 is directly contacted to the planarization layer 117 of the first substrate 100. In some embodiments, the frit 150 may include one or more additives such as a filler material for controlling a thermal expansion coefficient and/or an absorbent material that absorbs the laser beam or infrared rays. A glass frit powder may be formed by heating glass to a high temperature of and then rapidly cooling the glass such that frit powder is generated. In general, oxide powders are added to the frit material to be used for forming the frit 150. When an organic material is added to the frit 150 to which the oxide powders are added, a gel-type paste is obtained. The gel-type paste may then applied along a sealing line of the second substrate 200 corresponding to the non-pixel region of the substrate 100 where the non-planar structures 155 are formed. After applying the frit paste to the substrate 200, a thermal treatment is performed on the frit paste to heat the frit paste to a predetermined temperature such that the organic material is extinguished into the air and the gel-type paste is hardened such that a solid state glass frit is obtained. Here, the temperature at which the frit 150 is annealed is preferably in the range of about 300° C. to about 700° C. Annealing the frit at a temperature less than about 300° C. may not properly extinguish the organic material from the frit. It is not preferable to increase the annealing temperature to more than about 700° C.

Depending on the nature of the frit and the surface to which it is being attached, the integrating interface between the frit and the surface may comprise a trace of bonding. Traces of bonding may include a detectable interface where the properties of the materials being joined differ (e.g., a different refractive index). Additionally, the integrating interface may comprise substantially no bubbles or may comprise bubbles, depending on the conditions.

Figure 3B:
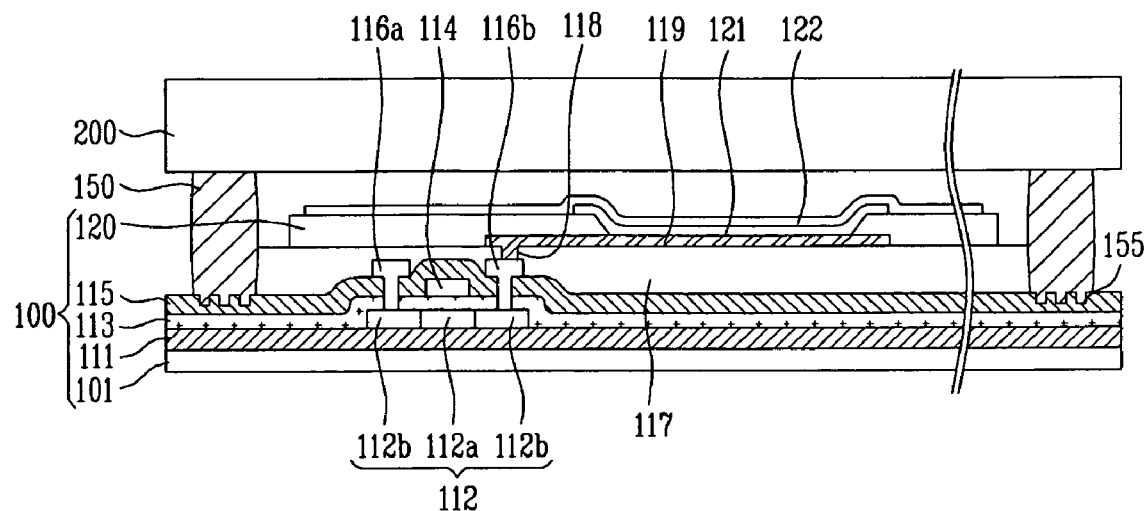
FIG. 3B illustrates an organic light emitting display according to another embodiment.

FIG. 3B illustrates an organic light emitting display according to another embodiment. In the embodiment shown in FIG. 3B, the planarization layer 117 is removed (e.g., by etching) from a portion of the non-pixel region of the substrate 100 and non-planar structures 155 are formed on the surface of the interlayer insulation layer 115. That is, according to this embodiment, the frit 150 is engaged to one or more valleys and peaks of the non-planar structures 155 formed on the interlayer insulation layer 115. The surface of the interlayer insulation layer 115 is etched to form one or more valleys and peaks, or other three-dimensional geometry, to increase the contact surface area (or integrating interface) where the interlayer insulation layer 115 contacts the frit 150. Therefore, the adhesive force between the first substrate 100 and the second substrate 200 provided by the frit 150 is improved.

In this embodiment, the interlayer insulation layer 115 is preferably formed of inorganic insulation layers. That is, although the process of radiating the laser or infrared rays onto the frit 150 to melt the frit 150 is performed, the inorganic layers are insensitive to heat so that the organic light emitting diode is not damaged. The non-planar structures 155 may be formed on the interlayer insulation layer 115 by etching, for example, dry etching. The dry etching may be performed by a method such as ion beam etching, RF sputtering etching, and/or reactive ion etching.

The non-planar structures 155 on the interlayer insulation layer 115 may be formed at the same time that contact holes (not shown) for electrically connecting the source and drain electrodes 116a and 116b and the source and drain regions 112b to each other are formed. Also, the process of etching away the portion of the planarization layer 117 may be performed together at the same time that the via hole 118 for electrically connecting the source and drain electrodes 116a and 116b and the first electrode 119 to each other is formed. Therefore, it is not necessary to perform additional process steps such as a masking step in order to make the non-planar structures on the interlayer insulation layer 115.

Figure 3C:
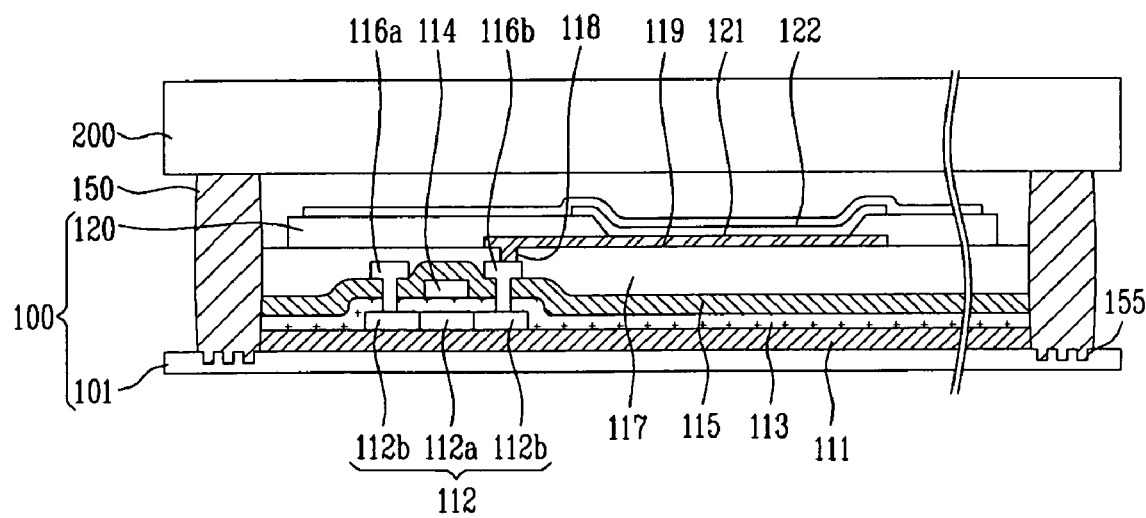
FIG. 3C illustrates an organic light emitting display according to another embodiment.

FIG. 3C illustrates an organic light emitting display according to another embodiment. In the embodiment shown in FIG. 3C, non-planar structures 155 are formed on the surface of the deposition substrate 101. That is, according to this embodiment, the frit 150 is engaged to one or more valleys and peaks of the non-planar structures formed on the deposition substrate 101. Therefore, one exposed region of the deposition substrate 101 in the non-pixel region contains the non-planar structures formed on the deposition substrate 101 to increase the contact surface area where the frit 150 engages the non-planar structures 155. Therefore, the adhesive force between the first substrate 100 and the second substrate 200 provided by the frit 150 is improved.

In this embodiment, the deposition layer 101 is preferably formed of inorganic material. Thus when the frit 150 is cured by irradiating the frit 150 with the laser beam or infrared rays the inorganic layers are insensitive to heat and the organic light emitting diode is not damaged. The non-planar structures on the surface of the deposition layer 101 may be formed by etching, for example, dry etching. The dry etching may be performed by a method such as ion beam etching, RF sputtering etching, and/or reactive ion etching.

The non-planar structures 155 may be formed in the non-pixel region of the deposition substrate 101. The non-pixel region can be any region where the thin film transistor (TFT) gate electrode 114, and source and drain electrodes 116a, and 116b and the organic light emitting diode layers 119, 121, and 122 are not formed. First, the buffer layer 111 is formed on the deposition substrate 101 and the gate insulation layer 113 is formed on the buffer layer 111. Then, the interlayer insulation layer 115 is formed on the gate insulation layer 113 and the planarization layer 117 is formed on the interlayer insulation layer 115. Portions of the upper layers 111, 113, 115 and 117 are removed to expose a portion of the deposition substrate 101. Then, one or more portions of the exposed non-pixel region is etched to form the non-planar structures 155 on the surface of the deposition substrate 101. The non-planar structures 155 may be formed of inorganic insulation layers insensitive to heat. Although not limited, SiNx or SiO2 may be used. The deposition substrate 101 may be formed of glass. The contact surface area where the frit 150 is engaged to the non-planar structures 155 formed on the disposition substrate 101 is increased so that the adhesive force between the first substrate 100 and the second substrate 200 provided by the frit 150 increases.

Various modifications can be made with respect to the non-planar structures discussed above in regard to the shapes illustrated in FIGS. 2A to 3B. Additionally, three-dimensional engaging structures may be formed on the second substrate 200 to increase the adhesion force of the frit to the second substrate as well. Additionally, three-dimensional engaging structures may be formed on the frit such that the frit may comprise a pre-formed engaging structure complementary to a three-dimensional engaging structure of one of the substrates. The frit may comprise a moldable material prior to melting, wherein contacting the frit with the three-dimensional engaging structure forms the complementary three-dimensional structure in the moldable material.

In the organic light emitting display according to the present invention and the method of fabricating the same, the surface of a substrate contacting the frit is made to have non-planar structures to increase the contact area where the frit engages one or more valleys and peaks of the non-planar structures formed on the surface oof the substrate and to thus improve the adhesive force between the substrate and the sealing substrate provided by the frit. Therefore, it is possible to effectively encapsulate the organic light emitting diode, to prevent the oxygen and moisture from penetrating, and to thus improve the life span and the emission efficiency of the organic light emitting display.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:
1. An organic light emitting device comprising:
  a first substrate;
  a second substrate;
  an array of organic light emitting pixels interposed between the first and second substrates; and
  a frit seal surrounding the array while interposed between and interconnecting the first and second substrates, wherein the frit seal and the first substrate are integrated with each other and form an integrating interface therebetween, and wherein the integrating interface comprises a three-dimensional geography comprising an undulating shape; wherein the integrating interface comprises a three-dimensional engaging surface of the first substrate and a complementary engaging surface of the frit.

2. The device of claim 1, wherein the undulating shape comprises at least one peak and at least one valley.
3. The device of claim 1, wherein the integrating interface is not substantially planar throughout.
4. The device of claim 1, wherein the three-dimensional geography further comprises at least one peak and at least one valley.
5. The device of claim 1, wherein the frit seal comprises one or more materials selected from the group consisting of magnesium oxide (MgO), calcium oxide (CaO), barium oxide (BaO), lithium oxide (Li2O), sodium oxide (Na2O), potassium oxide (K2O), boron oxide (B2O3), vanadium oxide (V2O5), zinc oxide (ZnO), tellurium oxide (TeO2), aluminum oxide (Al2O3), silicon dioxide (SiO2), lead oxide (PbO), tin oxide (SnO), phosphorous oxide (P2O5), ruthenium oxide (Ru2O), rubidium oxide (Rb2O), rhodium oxide (Rh2O), ferrite oxide (Fe2O3), copper oxide (CuO), titanium oxide (TiO2), tungsten oxide (WO3), bismuth oxide (Bi2O3), antimony oxide (Sb2O3), lead-borate glass, tin-phosphate glass, vanadate glass, and borosilicate.
6. The device of claim 1, wherein the integrating interface comprises a trace of bonding.
7. The device of claim 1, wherein the integrating interface substantially separates a material of the frit seal and a material of the first substrate.
8. The device of claim 7, wherein along the integrating interface, the material of the frit seal and the material of the first substrate are mixed together.
9. The device of claim 1, wherein the first substrate is made of a single layer.
10. The device of claim 1, wherein the first substrate comprises two or more layers of different materials.
11. The device of claim 10, wherein the integrating interface is formed in only one of the two or more layers.
12. The device of claim 10, wherein the integrating interface is formed through two or more of the layers.
13. The device of claim 1, wherein the first substrate further comprises structures that are separated from the integrating interface.
14. The device of claim 1, wherein the array is disposed on the first substrate.
15. The device of claim 1, wherein the array is disposed on the second substrate.
16. The device of claim 1, wherein the frit seal and the second substrate are integrated with each other and form another integrating interface therebetween, and wherein the other integrating interface comprises a three-dimensional geography.
17. The device of claim 1, wherein there are substantially no bubbles in the vicinity of the integrating interface.
18. The device of claim 1, wherein there are bubbles in the vicinity of the integrating interface.
19. A method of making an organic light emitting device according to claim 1, comprising:
  providing the first substrate, said first substrate comprising a three-dimensional engaging structure;
  providing the second substrate;
  interposing the frit and the array of organic light emitting pixels between the first and second substrates, while the frit surrounds the array;
  contacting the frit with the three-dimensional engaging structure of the first substrate; and
  melting and resolidifying at least part of the frit such that the frit is integrated with the three-dimensional engaging structure, thereby forming an integrating interface which comprises a three-dimensional geography comprising an undulating shape.

20. The method of claim 19, wherein the frit prior to melting comprises a moldable material, wherein contacting the frit with the three-dimensional engaging structure forms a complementary three-dimensional structure in the moldable material.

21. The method of claim 19, wherein the integrating interface is not substantially planar throughout.

22. The method of claim 19, wherein the undulating shape comprises at least one peak and at least one valley.

23. The method of claim 19, wherein the first substrate comprises two or more layers of different materials.

24. The method of claim 19, wherein the second substrate comprises a three-dimensional engaging structure, wherein the method further comprises contacting the frit with the three-dimensional engaging structure of the second substrate, and wherein melting and resolidifying further integrates the frit with the three-dimensional engaging structure of the second substrate, thereby forming another integrating interface which comprises a three-dimensional geography.

25. The method of claim 19, wherein the frit comprises a pre-formed engaging structure complementary to the three-dimensional engaging structure of the first substrate.

* * * * *